(12) United States Patent
Yoshiyama

(10) Patent No.: US 6,272,656 B1
(45) Date of Patent: Aug. 7, 2001

(54) SEMICONDUCTOR INTEGRATED CIRCUIT INCLUDING TEST FACILITATION CIRCUIT AND TEST METHOD THEREOF

(75) Inventor: Masayuki Yoshiyama, Chiba (JP)

(73) Assignee: Kawasaki Steel Corporation, Kobe (JP)

( * ) Notice: Subject to any disclaimer, the term of this patent is extended or adjusted under 35 U.S.C. 154(b) by 0 days.

(21) Appl. No.: 09/172,160

(22) Filed: Oct. 14, 1998

(30) Foreign Application Priority Data

Oct. 20, 1997 (JP) .................................................. 9-286996

(51) Int. Cl.[7] .................................................. G01R 31/28
(52) U.S. Cl. ............................................. 714/733; 714/724
(58) Field of Search ........................ 708/230; 326/46; 714/731, 727, 724, 726, 729, 733

(56) References Cited

U.S. PATENT DOCUMENTS

| 4,930,098 | * | 5/1990 | Allen | 708/230 |
|---|---|---|---|---|
| 4,933,575 | * | 6/1990 | Aso | 326/46 |
| 4,995,039 | * | 2/1991 | Sakashita et al. | 714/731 |
| 5,319,646 | * | 6/1994 | Simpson et al. | 714/727 |
| 5,450,415 | * | 9/1995 | Kamada | 714/727 |
| 5,459,735 | * | 10/1995 | Narimatsu | 714/731 |

* cited by examiner

*Primary Examiner*—Albert Decady
*Assistant Examiner*—David Ton
(74) *Attorney, Agent, or Firm*—Oliff & Berridge, PLC

(57) ABSTRACT

A semiconductor integrated circuit and method of use improve a rate of defect detection and also facilitate production of test patterns while suppressing an increase of the circuit area. The semiconductor integrated circuit includes a plurality of pairs of a sequence circuit and selector circuit. Each of the sequence circuits stores an operation result of an internal circuit, whereas each selector circuit is responsive to a control signal for selecting one of the data stored in its associated sequence circuit and an inverted version of the data to thereby output the selected data. A control circuit operates to count up or divide clocks and then control the selector circuits constituting the plurality of pairs in accordance with the resultant count values.

20 Claims, 5 Drawing Sheets

SEMICONDUCTOR INTEGRATED CIRCUIT INCLUDING TEST FACILITATION CIRCUIT AND TEST METHOD THEREOF

BACKGROUND OF THE INVENTION

1. Field of the Invention

The present invention relates generally to semiconductor integrated circuit devices including sequence circuits such as flip-flops and/or latches as well as testing method for use therewith. More particularly, the invention relates to a semiconductor integrated circuit capable of changing or varying the state of a circuit block of less controllability along with a test method therefor.

2. Description of the Prior Art

Conventionally, the so-called "scan-pass" test method has been well known as one of test facilitation schemes for semiconductor integrated circuits.

This scan-pass test method is for achieving facilitation of test procedures of semiconductor integrated circuits by replacing part or the whole of flip-flops which are sequence circuits in a semiconductor integrated circuit with a scannable flip-flop to provide a shift-register configuration while treating the remaining portions other than such one or more shift registers as a combination circuit thereby controlling the shift registers.

More than one latch may be also present in the sequence circuit other than the flip-flops. In cases where this semiconductor integrated circuit including a plurality of latches is tested by the scan-pass test method, two typical approaches have been known as will be described below.

The first approach is to perform the intended scan-pass test procedures by rendering the latch's enable signal active to let the latches operate with their operation mode being fixed in a "through" mode. This approach is to make latches combination circuits. The second approach is such that it is based on implementation of latches with a flop-flop configuration, wherein another latch is provided at the succeeding or post stage of a latch while regarding the pre-stage one as a "master" latch and also regarding its post stage as a "slave" latch operable as a flip-flop, whereby such flip-flop is accommodated into a shift register to thereby perform the scan-pass test.

In addition, with the scan-pass test method, when setting data into the shift register configuration, since this data setting is carried out through a shifting operation synchronized with a single clock, it is required that remedy against clock skew be employed in a way such that a buffer which reserves gain for a hold time period is inserted between neighboring flip-flops; or alternatively, for a non-synchronous circuit block in the circuitry, the circuit configuration is modified causing it to perform a synchronized operation with such clock during test operations.

However, in the prior known scan-pass test method, detection of defects near or around latches can become deficient due to the fact that the latches must be operatively fixed in the "through" mode according to the scheme of making latch to combination circuit. Furthermore, a feedback loop containing therein a latch or latches will possibly be formed in some cases, which would result in deficiency of defect detectivity also; accordingly, it has been difficult to obtain high defect detectability. On the other hand, with the latch-to-flip/flop function-change or "transmutation" scheme, an extra latch must be added per latch so that it suffers from a problem in that the area overhead can increase in circuitry which employs therein multiple latches.

In addition, concerning the scan-pass test method, the technique for inserting the buffer in order to attain the remedy against clock-skew stated supra is associated with a problem: when inserting buffers among all the flip-flops, the resulting area overhead increases; on the other hand, if such buffers are selectively inserted then the static analysis of circuitry should be required.

Another problem encountered with the prior art approaches is that with the aforementioned scheme for letting the non-synchronous circuit block operate as a synchronization circuit in the scan-pass test method, if a great number of non-synchronous circuit blocks are contained then the circuitry's area overhead can increase, which results in an extra delay taking place in a clock system thereby causing generation of extra process steps during design procedures in order to successfully meet the circuit specifications required.

Additionally in the recent years, semiconductor integrated circuits employing CMOS technology are the major devices in the art to which the invention pertains. In such semiconductor integrated circuits, small power supply current flows when circuitry is of no abnormality; it can thus be seen that the circuitry must contain certain abnormalities in cases power supply current greater in magnitude than or equal to a predefined level rushes to flow therein. In view of this fact, as one of the procedures for determining whether a semiconductor integrated circuit under inspection is acceptable or rejectable in quality, a test method may be effective which includes the steps of applying a test pattern for use in evaluation of the to-be-tested circuit of such semiconductor integrated circuit while at the same time monitoring the power supply current of the semiconductor integrated circuit. However, in order to increase the defect detectability of semiconductor integrated circuits, creation of a specific test pattern is required for use in sufficiently controlling the state or condition (whether in the ON state or in the OFF state) of elements which constitute the circuit being tested. In recent years, there is a problem which follows: as semiconductor integrated circuits increase both in functionality and in integration density, preparation of such test pattern becomes more difficult.

SUMMARY OF THE INVENTION

The present invention has been made by taking into consideration the technical background stated above, and its primary object is to provide a semiconductor integrated circuit capable of achieving high defect detectability and also facilitating the productivity of test patterns while reducing or minimizing the circuit area and also provide a testing method for use therewith.

To attain the foregoing object the instant invention provides a semiconductor integrated circuit which is featured by including a plurality of pairs of sequence circuit and selector circuit and further including a control circuit, wherein each of the sequence circuits is operable to store therein an operation result of internal circuitry of the semiconductor integrated circuit whereas each selector circuit is responsive to a control signal for selecting one of the data being stored in its associated sequence circuit and an inverted version of the data, and wherein the control circuit is responsible for controlling the selector circuits that constitute the plurality of pairs by counting up clocks or successively dividing the clocks to thereby provide a clock count value for use in controlling the selector circuits.

In prior known semiconductor integrated circuits, although the scan-pass testing method has been employed as one of the test facilitation schemes, the prior art is faced with the risk of an increase in area of circuitry for use in execution of the test procedures and an inability to obtain high defect detectability. On the contrary, with the semiconductor integrated circuit in accordance with the present invention, it becomes possible to permit flexible inputting of a test pattern comprised of the data and inverted data to a circuit being tested. This can be said because the semiconductor integrated circuit is specifically designed for the test to make use of a sequence circuit equipped therein for use during a standard operation thereby enabling selective outputting to the to-be-tested circuit one of the data being stored in the sequence circuit and an inverted version of such data. With such an arrangement, it is possible to well control the state of elements constituting such to-be-tested circuit while simultaneously suppressing or minimizing an increase in area of circuitry for testing. This in turn makes it possible to increase the defect detectability of the semiconductor integrated circuit to thereby render easier creation or preparation of the intended test patterns.

In accordance with another aspect of the invention to attain the above objective, a testing method is provided for use with a semiconductor integrated circuit including a plurality of pairs of sequence circuit and selector circuit and also including a control circuit, wherein each of the sequence circuits stores therein an operation result of internal circuitry of the semiconductor integrated circuit, whereas each selector circuit is operatively responsive to a control signal for selecting one of the data stored in its associated sequence circuit and an inverted version of the data, and wherein the control circuit controls the selector circuits that constitute the plurality of pairs by counting up clocks or sequentially dividing the same to thereby provide the resultant clock count value for use in controlling the selector circuits, the method being featured by letting the semiconductor integrated circuit perform an operation containing a selector circuit controlling operation by the control circuit. A further feature is that the method includes the steps of monitoring a power supply current of the semiconductor integrated circuit while performing the above-mentioned operation.

According to the semiconductor integrated circuit test method of the invention, it becomes possible to allow the defect detectability to increase while making easier the creation of test patterns required. This can be said because the use of the aforesaid method may enable those elements constituting the to-be-tested circuit to be well controlled in state.

These and other objects, features and advantages of the invention will be apparent from the following more particular description of preferred embodiments of the invention, as illustrated in the accompanying drawings.

DETAILED DESCRIPTION OF THE INVENTION

Some preferred embodiments of the present invention will be explained with reference to the accompanying drawings.

Figure 1:
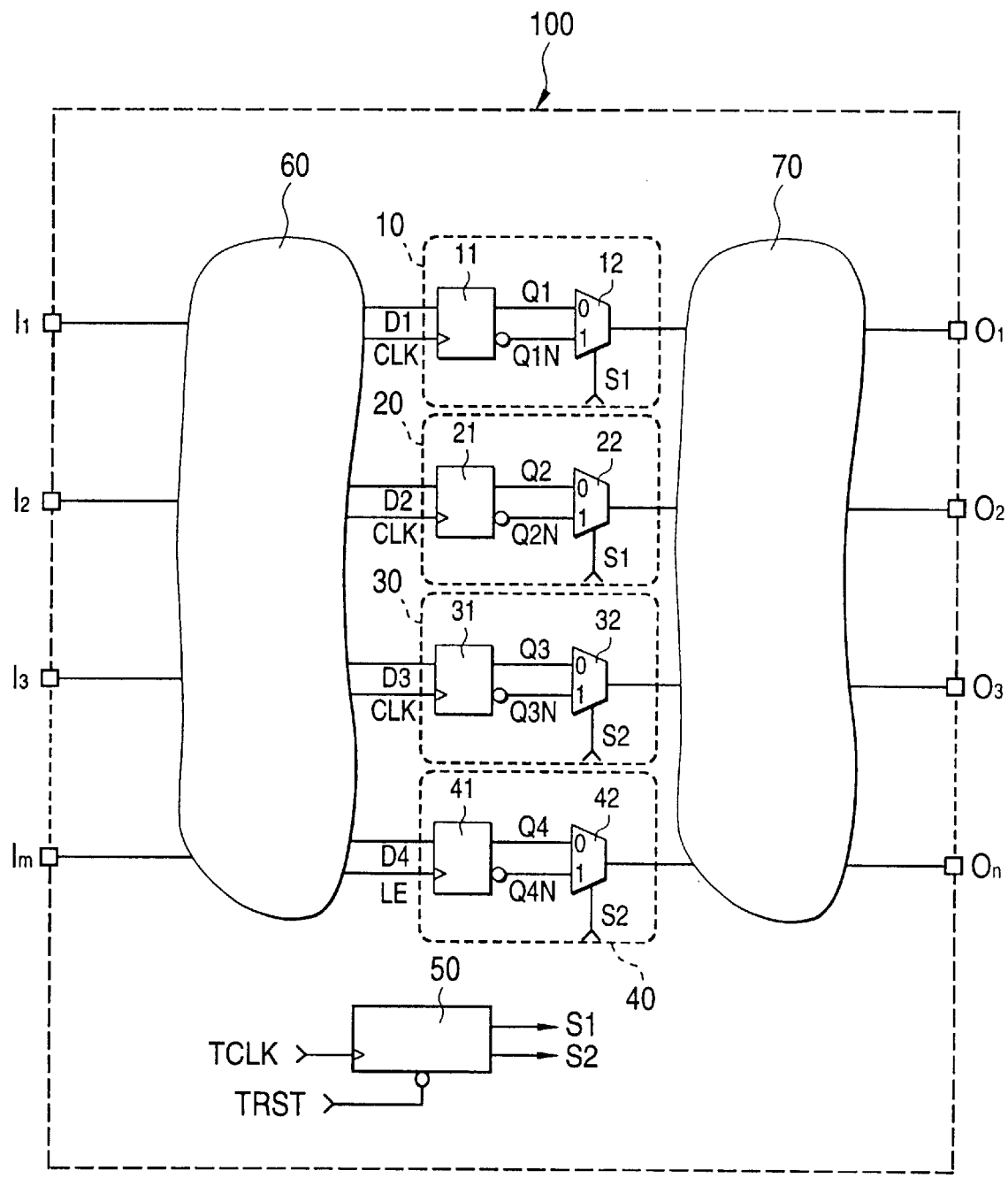
FIG. 1 is a diagram showing a pictorial representation of a semiconductor integrated circuit in accordance with the present invention.

FIG. 1 is a diagram showing the principles of this invention.

A semiconductor integrated circuit 100 shown in FIG. 1 is arranged to operate in two different modes: a standard operation mode for execution of an ordinary or standard operation, and a test mode for test/inspection procedures. This semiconductor integrated circuit 100 is provided with random logical circuits 60, 70 each of which comprises a combination circuitry. In addition, there are provided between these random logic circuits 60, 70 a unit test circuit 10 consisting essentially of a pair of a flip-flop circuit 11 and a selector circuit 12, a unit test circuit 20 including a pair of a flip-flop 21 and a selector 22, a unit test circuit 30 including a pair of a flip-flop 31 and selector 32, and a unit test circuit 40 including a pair of a latch 41 and selector 42. In the illustrative embodiment, only four unit test circuits 10–40 are employed only for purposes of convenience in illustration and discussion herein, but any given number of such circuits may be employable on a case-by-case basis. Moreover in this semiconductor integrated circuit 100, a control circuit 50 is also provided.

In FIG. 1, while the random logic circuit 60 comes with its input nodes or terminals I1–Im (where "m" is an integer) for receipt of input signals externally supplied thereto, this is for purposes of facilitation of explanation only, and another random logic circuit and a plurality of unit test circuits may optionally be inserted between the input terminals I1–Im and the random logic circuit 60. Still alternatively, although the illustrative random logic circuit 70 is equipped with output terminals O1–On ("n" is an integer) for use in outputting a signal or signals toward external circuitry operatively associated therewith, another random logic circuit and plural unit test circuits may also be inserted between the random logic circuit 70 and the output terminals O1–On.

The random logic circuit 60 generates data signals D1, D2, D3 and clock signals CLK which are input to respective flip-flops 11, 21, 31. The logic circuit 60 also generates a data signal D4 and a latch enable signal LE which are then input to the latch 41. Here, the clocks CLK may be input externally, or alternatively may be generated internally.

The data D1, D2, D3 are taken into the flip-flops 11, 21, 31 in a way synchronized to the clocks CLK whereby data signals Q1, Q2, Q3 are output from the flip-flops 11, 21, 31 along with a logically inverted version of the individual one of such data—i.e. inverted data signals Q1N, Q2N, Q3N. The data Q1, Q2, Q3 are then input to respective input terminals "0" of the selectors 12, 22, 32, while the inverted data Q1N, Q2N, Q3N are input to respective input terminals "1" of selectors 12, 22, 32. On the other hand, the latch 41 is set in a "through" mode in response to the latch enable signal LE having a High or H level, thereby allowing the latch 41 to output the data Q4 and its inverted data Q4N. These data Q4, Q4N are in turn input to the input terminals "0" and "1" of the selector 42.

An explanation will be given with reference to FIG. 1 and FIG. 2 below.

Figure 2:
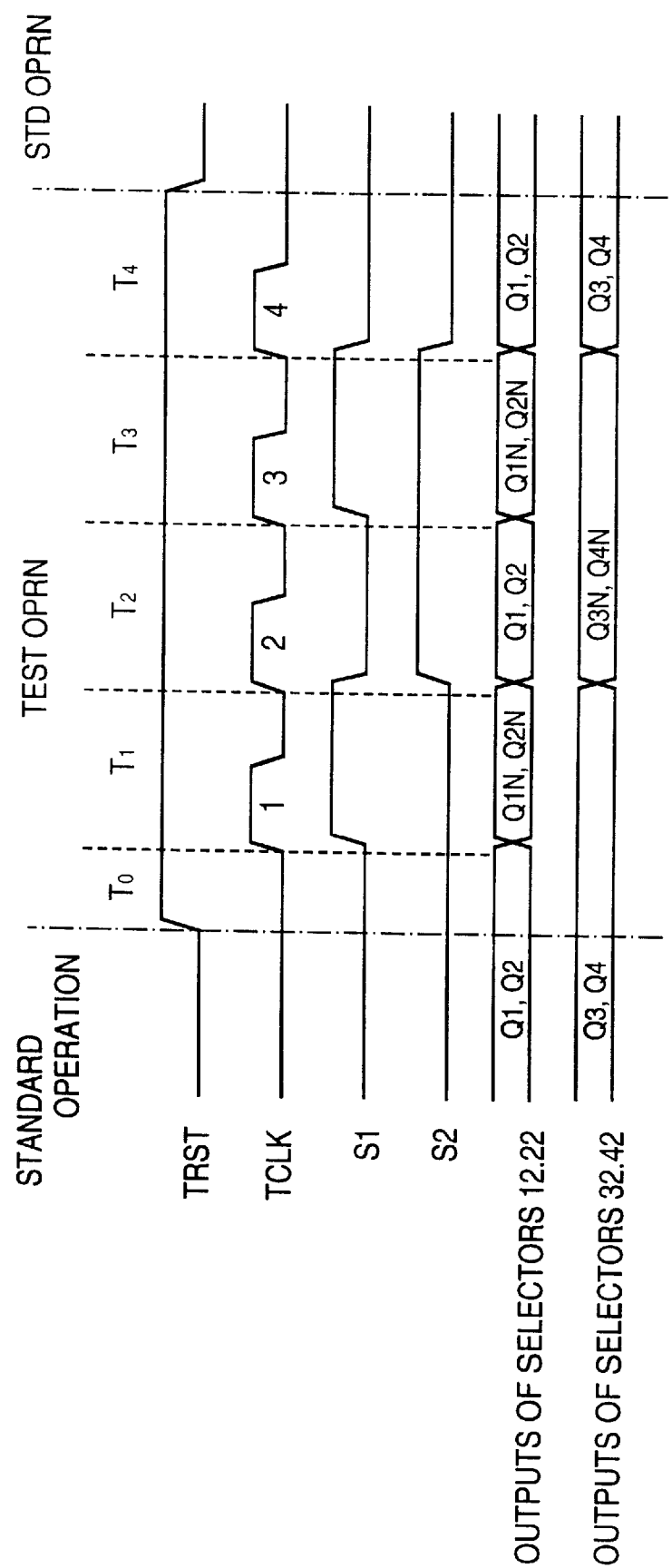
FIG. 2 is a diagram showing one exemplary timing chart for explanation of an operation of the semiconductor integrated circuit shown in FIG. 1.

FIG. 2 is one example of a timing chart for explanation of an operation of the semiconductor integrated circuit shown in FIG. 1. In this timing chart of FIG. 2, the control circuit 50 of FIG. 1 makes use of a divider circuit which is operable to successively divide a test clock signal TCLK to thereby output a 2-frequency-divided signal S1 and 4-frequency-divided signal S2. However, this is also for purposes of convenience in explanation only, and any circuitry capable of generating output signals at any given numbers may be employed alternatively, which signals may be generated preferably by use of more than one counter and/or frequency-divider.

First of all, the standard operation mode of the semiconductor integrated circuit 100 will be explained below.

In the standard operation mode a test reset signal TRST having a Low or L level as shown in FIG. 2 is input to the control circuit 50. Then, the control circuit 50 is set in the disenable state causing control signals S1, S2 both at L level to be output from the control circuit 50, which signals are then input to respective control terminals of the selectors 12, 22, 32, 42. Substantially simultaneously, the data signals D1, D2, D3, D4 originated from a standard operation are output from the random logic circuit 60; the data D1, D2, D3 of these signals are taken into the flip-flops 11, 21, 31 at a timing synchronized to the clock CLK; and, in responding to receipt of the latch enable signal LE of H level, the data D4 passes through such latch 41 whereby data Q1, Q2, Q3, Q4 are input to respective input terminals "0" of respective selectors whereas the inverted data Q1N, Q2N, Q3N, Q4N are input to respective input terminals "1".

Since the control signals S1, S2 both of which are at L level are being input from the control circuit 50 to the control terminals of the selectors 12, 22, 32, 42, the data Q1, Q2, Q3, Q4 which have been input to respective input terminals "0" are selectively output from these selectors to the random logical circuit 70. In this way the standard operation of the semiconductor integrated circuit 100 is carried out.

An explanation will next be given of the test mode of the semiconductor integrated circuit 100 hereafter.

In the test mode the test reset signal TRST having the H level as shown in FIG. 2 is input to the control circuit 50. Also, a test pattern is input to the random logic circuit 60 via the input terminals I1–Im of the semiconductor integrated circuit 100 in a way synchronous with the test clock TCLK. Simultaneously, power supply current of the semiconductor integrated circuit 100 is monitored.

In a time period T0 spanning from a time point at which the test reset signal TRST of H level has been input up to an instant whereat an initial test clock TCLK is input, the control signals S1, S2 both having L level are being output from the control circuit 50; thus, at the selectors 12, 22, 32, 42, the data Q1, Q2, Q3, Q4 which are continuously being input to the input terminals "0" are being selected and output.

Here, a first test clock TCLK is input to the control circuit 50. The time period $T_0$ shown in FIG. 2 is shifted to a period $T_1$. Also, the data D1, D2, D3, D4 responsive to a presently available test pattern are output from the random logic circuit 60; specified ones of these data D1, D2, D3, D4—here, data D1, D2, D3—are accommodated into the flip-flops 11, 21, 31 in response to the clock CLK. The remaining data D4 passes through the latch 41 in reply to the latch enable signal LE of H level whereby data Q1, Q2, Q3, Q4 are input to respective input terminals "0" of the selectors 12, 22, 32, 42 while causing the inverted data Q1N, Q2N, Q3N, Q4N to be input to respective input terminals "1". Because the first test clock TCLK is input to the control circuit 50, the control signal of L level being output from the control circuit 50 is changed in potential to have H level. This control signal S1 of H level is then input to the control terminals of the selectors 12, 22 whereby at the selectors 12, 22 the inverted data Q1N, Q2N being presently input to respective input terminals "1" thereof are selectively output and then input to the random logic circuit 70. On the other hand, at the selectors 32, 42, the data Q3, Q4 being input to respective input terminals "0" thereof are directly selected and output, and are then input to the random logic circuit 70. At the random logic circuit 70, test is carried out based on these inverted data Q1N, Q2N and data Q3, Q4 within the period $T_1$.

Next, a second test clock TCLK is input to the control circuit 50. Then, the control signal S1 of H level being output from the control circuit 50 is potentially changed to L level while at the same time letting the control signal S2 of L level change to H level. Simultaneously, the period $T_1$ is shifted to a time period $T_2$. Since the control signal S1 of L level is being input to the selectors 12, 22, the data Q1, Q2 being input to their respective input terminals "0" are selected for output at these selectors 12, 22, and are then input to the random logic circuit 70. On the other hand, the control signal S2 of H level is input to the selectors 32, 42; thus, at the selectors 32, 42, the inverted data Q3N, Q4N being input to respective input terminals are input to the random logic circuit 70. At the random logic circuit 70 a test is performed on the basis of these data Q1, Q2 and inverted data Q3N, Q4N in the period $T_2$.

Thereafter, a third clock TCLK is input to the control circuit 50. Then, the control signal S1 of L level being output from the control circuit 50 is changed at H level whereas the control signal S2 of H level is forced to maintain its present potential level. The period $T_2$ shown in FIG. 2 is shifted to a time period $T_3$. The control signal S1 of H level is input to the selectors 12, 22; accordingly, at these selectors 12, 22, the inverted data Q1N, Q2N being input to respective input terminals "1" thereof are selectively output and are then input to the random logic circuit 70. On the other hand, the control signal S2 of H level is being directly input to the selectors 32, 42; thus, at these selectors 32, 42, the inverted data Q3N, Q4N that are presently input to respective input terminals "1" are directly selected and output and are then input to the random logic circuit 70. At the random logic circuit 70 a test is done based on these inverted data Q1N, Q2N, Q3N, Q4N within the period $T_3$.

Next, a fourth test clock TCLK is input to the control circuit 50. Then, the control signals S1, S2 both of which are at H level and which are presently output from the control circuit 50 are simultaneously changed in potential to L level. Due to this, at the selectors 12, 22, 32, 42, the data Q1, Q2, Q3, Q4 being input to respective input terminals "0" are selected for output and are then input to the random logic circuit 70. At the random logic circuit 70 a test is performed based on these data Q1, Q2, Q3, Q4 in the period $T_4$. In this way, with the semiconductor integrated circuit 100 embodying the invention, it becomes possible to suppress or minimize any possible increase in area of testing circuitry. This can be said because the unit test circuits 10, 20, 30, 40 are configured by using the flip-flops 11, 21, 31 and the latch 41 provided in the semiconductor integrated circuit 100 to be adapted for use during standard operations while the selectors 12, 22, 32, 42 are used to selectively output the data Q1, Q2, Q3, Q4 and inverted data Q1N, Q2N, Q3N, Q4N as output from these flip-flops 11, 21, 31 and latch 41 and then outputting to the random logic circuit 70 at the post stage thereof. It is also possible to sufficiently control the state of those elements constituting the random logic circuit 70 due to the fact that a variety of kinds of test patterns that are available by combination of the data Q1, Q2, Q3, Q4 with the inverted data Q1N, Q2N, Q3N, Q4N are to be input to the random logic circuit 70. Consequently, the defect detectability factor of the semiconductor integrated circuit 100 may increase while at the same time facilitating creation of test patterns required.

Figure 3:
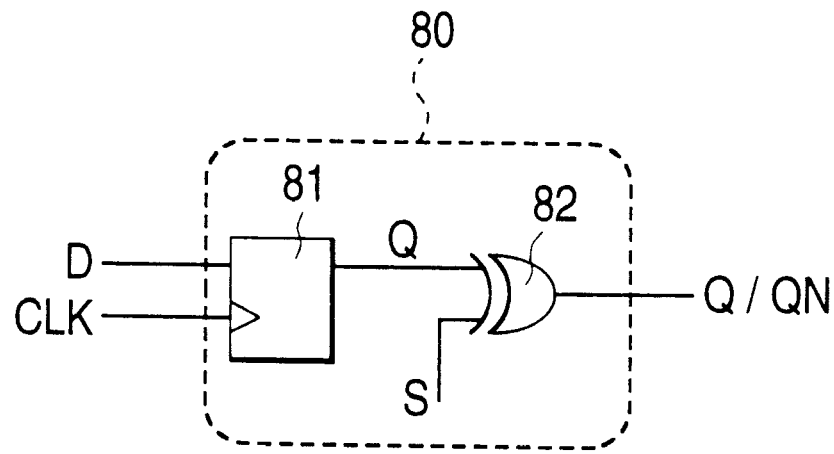
FIG. 3 is a diagram showing one exemplary configuration of a unit test circuit shown in FIG. 1.

FIG. 3 is a diagram showing an exemplary configuration of an actually implemented example of one of the unit test circuits shown in FIG. 1.

A unit test circuit 80 includes a pair of a flip-flop circuit 81 and two-input Exclusive-OR gate 82. Data D and a clock CLK are input to the flip-flop 81. The data D as input to the flip-flop 81 is then fetched in a way synchronous with the clock CLK so that data Q is output. The output data Q is input to one input node of the 2-input Exclusive-OR gate 82. A control signal S is input to the remaining input node of the Exclusive-OR gate 82. When the control signal S of L level, the data Q is directly output from such Exclusive-OR gate 82 without any level conversion effected thereto. On the other hand, when the control signal S of H level is input, an inverted data QN is output from the 2-input Exclusive-OR gate 82. As stated above, since the unit test circuit 80 is configured from the flip-flop 81 for use during standard operations and simple 2-input Exclusive-OR gate 82, it becomes possible to decrease the scale of circuitry as required for execution of test procedures.

Figure 4:
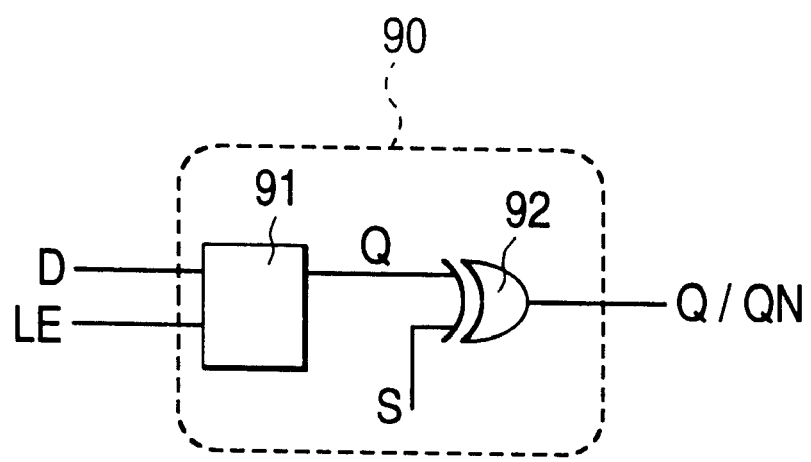
FIG. 4 is a diagram illustrating another exemplary configuration of the unit test circuit shown in FIG. 1.

FIG. 4 is a diagram showing a configuration of another actually implemented example of one of the unit test circuits shown in FIG. 1.

The unit test circuit 90 shown in FIG. 4 includes a pair of a latch 91 for use during standard operations and a two-input Exclusive-OR gate 92. Data D and latch enable signal LE are input to the latch 91. The data D being input to the latch 91 passes through it in a way synchronous with the latch enable signal LE of H level whereby data Q is output. The output data Q is input to one input of the Exclusive-OR gate 92. A control signal S is input to the other input of the Exclusive-OR gate 92. When a control signal S of L level is input as the control signal S, the data Q is directly output from the Exclusive-OR gate 92 with no signal processing applied thereto. On the other hand, when a control signal S of H level is input, an inverted data QN is output from the Exclusive-OR gate 92. As stated previously, since the unit test circuit 90 is made up of the latch 91 used during standard operations and simple Exclusive-OR gate 92, it is likewise possible to decrease the scale of circuitry required for execution of test procedures.

Figure 5:
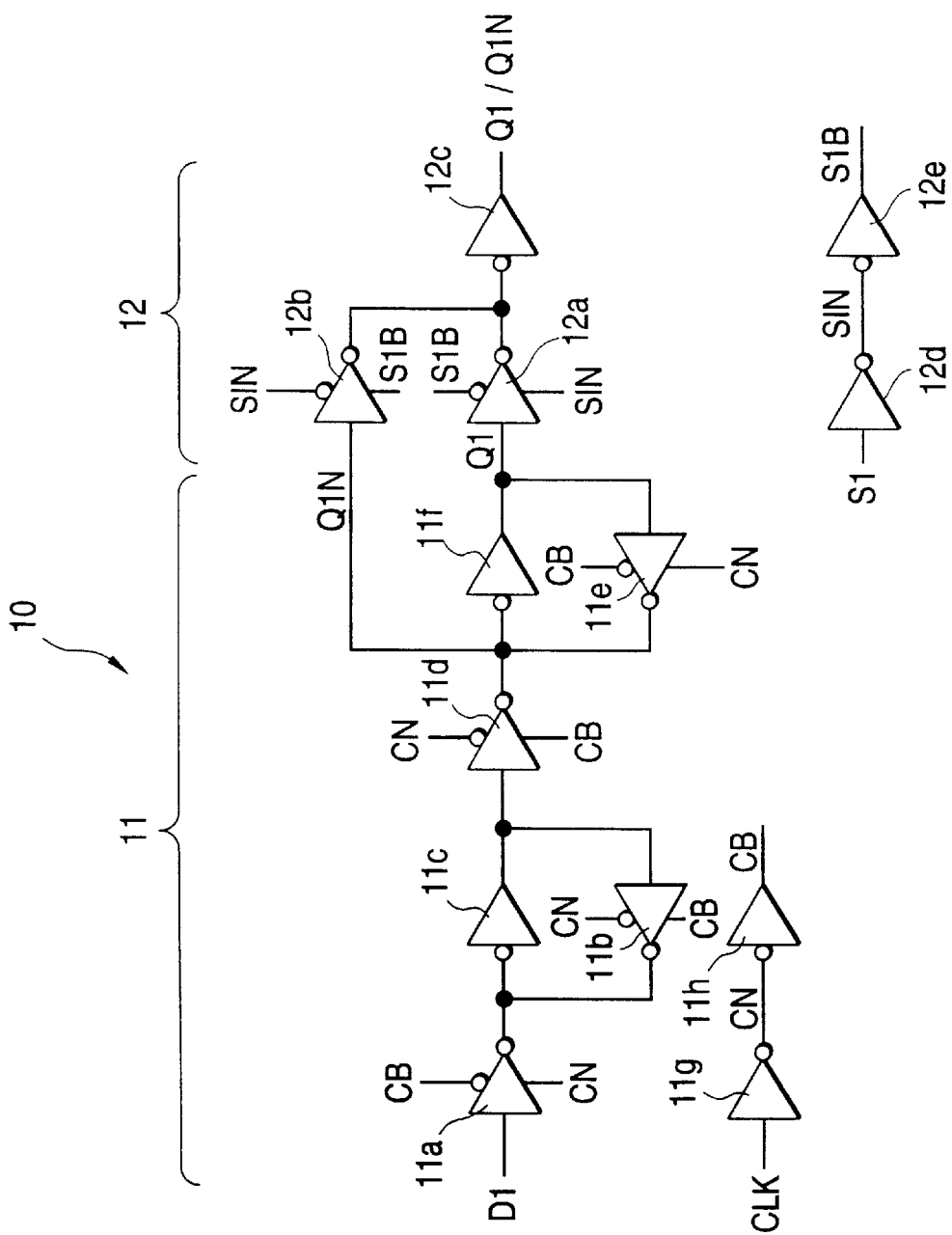
FIG. 5 illustrates one example of a detailed configuration of a unit test circuit which consists essentially of a pair of a flip-flop and a selector shown in FIG. 1.

FIG. 5 is one example of a detailed circuit diagram of the unit test circuit configured including a pair of flip-flop and selector shown in FIG. 1.

In FIG. 5, a circuit configuration of the unit test circuit 10 is shown. An operation of the flip-flop 11 will first be explained below.

The flip-flop 11 is provided with clocked inverters 11a, 11b and an inverter 11c which may constitute a "master" latch, along with clocked inverters 11d, 11e and an inverter 11f constituting a "slave" latch, as well as inverters 11g, 11h that constitute a clock circuit. Data D1 and clock CLK are input to such flip-flop 11. At the flip-flop 11, while its input clock CLK is at L level, a reverse or negative-phase clock CN of H level and positive-phase clock signal CB of L level are input to respective clocked inverters 11a, 11b, 11d, 11e. Due to this, the clocked inverters 11a, 11e are set in the ON state whereas the clocked inverters 11b, 11d are in the OFF state. Accordingly, the data D1 as input to the flip-flop 11 is inverted in polarity at the inverter 11c via the clocked inverter 11a, and is then input to the slave latch. At the slave latch, since the clocked inverters 11d, 11e are in the OFF state and ON state respectively, data presently being stored in the slave latch is output as the data Q1 and inverted data Q1N of the flip-flop 11 irrespective of the data D1 being input to the flip-flop 11.

Next, the clock CLK changes in potential from L level to H level. Then, L level is output as the negative-phase clock CN; further, H level is output as the positive-phase clock CB. These negative-phase clock CN of L level and positive-phase clock CB of H level are input to respective clocked inverters. Thus, the clocked inverters 11a, 11e are set in the OFF state, while the clocked inverters 11b, 11d are in the ON state. Then, the data D1 being input to the master latch is latched at such master latch. The data D1 latched in the master latch is input to the slave latch. Here, since the clocked inverters 11d, 11e of the slave latch are in the ON state and OFF state respectively, the data D1 being input to the slave latch is output as the inverted data Q1N through the clocked inverter 11d, and further inverted by the inverter 11f to be output as the data Q. In other words the data D1 input to the flip-flop 11 is output from the flip-flop 11 as the data Q1 and inverted data Q1N toward the selector 12 at a timing synchronized to the rising edge of a clock CLK.

Next, the selector 12 will be explained.

The selector 12 is configured including clocked inverters 12a, 12b and inverters 12c, 12d, 12e. Data Q1 and its inverted data Q1N are input to the clocked inverters 12a, 12b whereas a control signal S1 is input to the inverter 12d. Upon inputting of L level as the control signal S1, H level is output from the inverter 12d as a negative-phase control signal S1N; further, L level is output from the inverter 12e as a positive-phase control signal S1B. These signals are then input to the clocked inverters 12a, 12b. Thus, the clocked inverters 12a, 12b are set in the ON state and OFF state respectively, thereby allowing data Q1 to be output via the clocked inverters 12a, 12c.

On the other hand, when H level is input as the control signal S1, L level is output as the negative-phase control signal S1N while H level is output as the positive-phase control signal S1B at this time. Thus, the clocked inverters 12a, 12b are in the OFF state and ON state respectively letting the inverted data Q1N be output via the clocked inverter 12b and inverter 12c. As stated above, since the unit test circuit 10 is configured from the flip-flop 11 for use during standard operations and the selector 12 that is simple in configuration, it is possible to reduce the area of circuitry required for testing. Note that regarding the unit test circuits 20, 30 also, the same circuit configuration is employable as that of the unit test circuit 10. Also note that although in the above description one detailed example has been explained in regard to the D-type flip-flop, similar circuitry may be considered with respect to flip-flops of other types (e.g. JK type, RS type, and the like).

Figure 6:
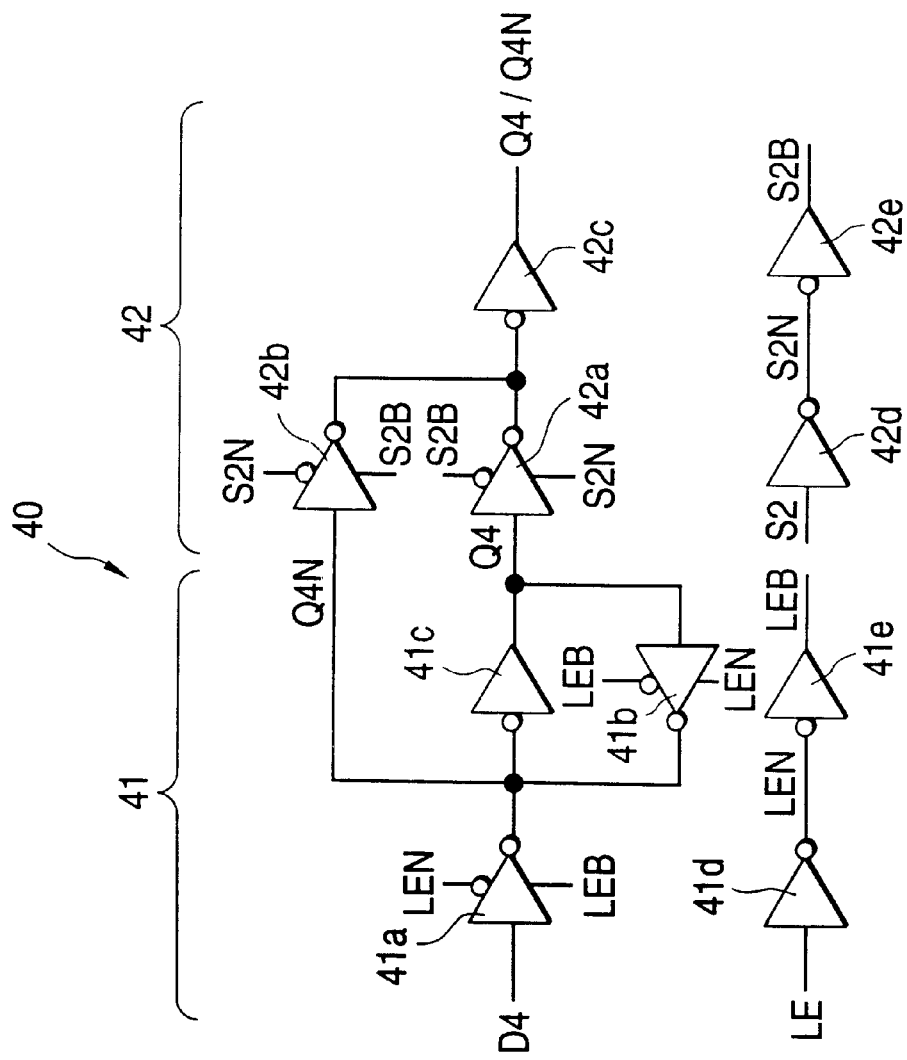
FIG. 6 shows one example of a detailed configuration of a unit test circuit consisting essentially of a pair of a latch and a selector shown in FIG. 1.

FIG. 6 is one exemplary detailed circuit diagram of the unit test circuit 40 that consists essentially of a pair of the latch 41 and selector 42 shown in FIG. 1.

The latch 41 is configured from clocked inverters 41a, 41b and inverters 41c, 41d, 41e, while the selector 42 is from clocked inverters 42a, 42b and inverters 42c, 42d, 42e. Data D4 and latch enable signal LE are input to the latch 41. At the latch 41, when the latch enable signal LE is at L level, H level is being output as a negative-phase latch enable signal LEN, and L level is output as a positive-phase latch enable signal LEB, wherein the clocked inverters 41a, 41b are in the ON state and OFF state, respectively. Accordingly, any data that is presently stored in the latch 41 is being output as the latch 41's data Q4 and inverted data Q4N without regard to the state of the data D4 being input to the latch 41.

Here, when the latch enable signal LE changes in potential at H level, the clocked inverters 41a, 41b are in the On state and OFF state thereby allowing data D4 to be output as the inverted data Q4N via the clocked inverter 41a and further be output as data Q4 via the inverter 41c. In other words, the data D4 as input to the latch 41 passes through it in a way synchronous with the latch enable signal LE of H level, and is then output from the latch 41 as the data Q4 and inverted data Q4N. These data Q4 and inverted data Q4N are input to the clocked inverters 42a, 42b which constitute the selector 42. At the selector 42, when L level is input as a control signal S2, H level is output as a negative-phase control signal S2N whereas L level is output as a positive-phase control signal S2B. This allows the clocked inverters 42a, 42b to be in the ON state and OFF state respectively to thereby let the data Q4 be output via the clocked inverter 42a and inverter 42c.

On the other hand, upon inputting of H level as the control signal S2, L level is output as the negative-phase control signal S2N while H level is output as the positive-phase control signal S2B in this case. Thus, the clocked inverters 42a, 42b are set in the OFF state and ON state causing the inverted data Q4N to be output via the clocked inverter 42b and inverter 42c. In the way stated above, since the unit test circuit 40 is also configured from the latch 41 for use during standard operations and simple selector 12, it is possible to reduce or minimize the circuit area.

As has been described above, according to the present invention, it is possible to obtain high defect detectability factor while suppressing an increase in area of testing circuitry and also possible to facilitate creation of test patterns required.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor integrated circuit comprising:
 a plurality of unit test circuits;
 said unit test circuits including a pair of a sequence circuit and a selector circuit, the sequence circuit storing therein an operation result of an internal circuit, the selector circuit being responsive to a control signal which selects one of two execution modes of a standard mode and an inversion mode for selecting and outputting one of data stored in the sequence circuit and an inverted version of the data; and
 a control circuit for generation of the control signal to be supplied to said selector circuit.

2. The semiconductor integrated circuit of claim 1, characterized in that said sequence circuit constituting said unit test circuit is one of a flip-flop and a latch.

3. The semiconductor integrated circuit of claim 2, characterized in that said control circuit for supplying the control signal to the selector circuit is a circuit having a test reset signal input and a test clock signal input and outputting a plurality of control signals.

4. The semiconductor integrated circuit of claim 3, characterized in that said control circuit is arranged to generate the plurality of control signals by counting or successively dividing the test clock signal after the test reset signal is at one of an H state and L state.

5. The semiconductor integrated circuit of claim 4, characterized in that said selector circuit is operable to input any one of the data stored in one of the flip-flop and latch and its inverted data, and then output such selected data in response to the control signal.

6. The semiconductor integrated circuit of claim 4, characterized in that said selector circuit is a circuit for inputting the data stored in one of the flip-flop and latch and for outputting such data in response to the control signal or inverting and outputting said data.

7. The semiconductor integrated circuit of claim 6, characterized in that said selector circuit is a two-input Exclusive-OR circuit having its one input for inputting an output of one of the flip-flop and latch and a remaining input for inputting the control signal.

8. The semiconductor integrated circuit of claim 2, characterized in that said flip-flop includes one of a D flip-flop, T flip-flop, JK flip-flop, and RS flip-flop.

9. A semiconductor integrated circuit including a plurality of input terminals, a plurality of output terminals, a random logical circuit composed of a combination circuit, and a plurality of flip-flops and/or latches, characterized by further including: a selector circuit provided in a way corresponding to each of part or all of the flip-flops or latches of said plurality of flip-flops and/or latches, for selecting and outputting one of the data stored in a corresponding flip-flop or latch and an inverted output data of the data in response to a control signal as supplied from a control circuit; and the control circuit for generating the control signal to be supplied to said selector circuit.

10. The semiconductor integrated circuit of claim 9, characterized in that said control circuit is a circuit having a test reset signal input and a test clock signal input and outputting a plurality of control signals.

11. The semiconductor integrated circuit of claim 10, characterized in that said test reset signal and test clock signal are supplied from an outside of the semiconductor integrated circuit.

12. The semiconductor integrated circuit of claim 10, characterized in that said control circuit is arranged to generate a plurality of control signals by counting or dividing the test clock signal after the test reset signal is at one of an H state and L state.

13. The semiconductor integrated circuit of claim 11, characterized in that said control circuit is arranged to generate a plurality of control signals by counting or dividing the test clock signal after the test reset signal is at one of an H state and L state.

14. The semiconductor integrated circuit of claim 12, characterized in that said selector circuit inputs two signals of the data stored in the flip-flop or latch and its inverted data, and outputs either one of them in response to the control signal.

15. The semiconductor integrated circuit of claim 13, characterized in that said selector circuit inputs two signals of the data stored in the flip-flop or latch and its inverted data, and outputs either one of them in response to the control signal.

16. The semiconductor integrated circuit of claim 14, characterized in that said selector circuit is a circuit which inputs the data stored in the flip-flop or latch and performs, in responding to the control signal, one of outputting such data and outputting inverted the data.

17. The semiconductor integrated circuit of claim 15, characterized in that said selector circuit is a circuit which inputs the data stored in the flip-flop or latch and performs, in response to the control signal, one of outputting such data and inverting the data to output the same.

18. The semiconductor integrated circuit of claim 17, characterized in that said selector circuit is a two-input Exclusive-OR circuit having its one input for inputting an output of one of the flip-flop and latch and a remaining input for inputting the control signal.

19. A test method for use with a semiconductor integrated circuit including a plurality of input terminals, a plurality of output terminals, a random logical circuit comprising a combination circuit, and a plurality of flip-flops and/or latches, the semiconductor integrated circuit further including a selector circuit provided in correspondingly to each of part or all of flip-flops or latches of said plurality of flip-flops and/or latches for selecting and outputting any one of data stored in a corresponding flip-flop or latch and an inverted version of the data in response to a control signal being supplied from a control circuit, and the control circuit for generating the control signal to be supplied to said selector circuit, characterized by letting the semiconductor integrated circuit execute an operation including a control operation of the selector circuit by said control circuit.

20. The test method for the semiconductor integrated circuit of claim 19, further including monitoring a power supply current of said semiconductor integrated circuit while permitting execution of the selector control operation by said control circuit.

* * * * *